United States Patent
Ikeda et al.

(10) Patent No.: US 8,421,657 B2
(45) Date of Patent: Apr. 16, 2013

(54) AD CONVERSION CIRCUIT AND ERROR CORRECTING METHOD

(75) Inventors: Atsushi Ikeda, Tochigi (JP); Nobuchika Ochi, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 152 days.

(21) Appl. No.: 13/075,337

(22) Filed: Mar. 30, 2011

(65) Prior Publication Data
US 2011/0241913 A1 Oct. 6, 2011

(30) Foreign Application Priority Data

Mar. 31, 2010 (JP) ................................ 2010-081177

(51) Int. Cl.
*H03M 1/06* (2006.01)
(52) U.S. Cl.
USPC .......................................... 341/118; 341/155
(58) Field of Classification Search ............... 341/118, 341/120, 155; 361/18
See application file for complete search history.

(56) References Cited

U.S. PATENT DOCUMENTS

| 5,638,307 | A | * | 6/1997 | Kamimura et al. | 713/321 |
|---|---|---|---|---|---|
| 7,760,122 | B1 | * | 7/2010 | Zortea | 341/155 |
| 2011/0057724 | A1 | * | 3/2011 | Pabon | 327/581 |
| 2011/0242709 | A1 | * | 10/2011 | Ikeda et al. | 361/18 |
| 2012/0188885 | A1 | * | 7/2012 | Tazebay et al. | 370/252 |
| 2012/0242520 | A1 | * | 9/2012 | Noguchi et al. | 341/118 |

FOREIGN PATENT DOCUMENTS

| JP | 6-204868 | 7/1994 |
|---|---|---|
| JP | 2005-244771 | 9/2005 |

* cited by examiner

*Primary Examiner* — Peguy Jean Pierre
(74) *Attorney, Agent, or Firm* — Rankin, Hill & Clark LLP

(57) ABSTRACT

In a microcomputer 10 which converts an analog signal Vin into digital data and corrects an error of the digital data, a voltage variation ΔVcc is calculated on the basis of a first conversion value obtained by AD-converting a reference voltage Vref by an AD converter 15 in a state that a standard power source voltage including no voltage variation is supplied to the AD converter 15 and a second conversion value obtained by AD-converting the reference voltage Vref by the AD converting section in a state that a power source voltage for the ordinary operation is supplied to the AD converter 15. The digital data produced by the AD converter 15 by AD-converting the analog signal Vin is corrected using the calculated voltage variation ΔVcc.

6 Claims, 7 Drawing Sheets

INPUT VOLTAGE (V)

AD CONVERSION CIRCUIT AND ERROR CORRECTING METHOD

BACKGROUND OF THE INVENTION

1. Field of the Invention

The present invention relates to an AD conversion circuit which converts an analog signal into digital data and an error correcting method employed in such an AD conversion circuit.

2. Related Art

In general, various kinds of control such as engine control of an automobile are performed by a control microcomputer or a CPU (hereinafter referred to generically as "microcomputer) on the basis of output values of various sensors. Analog signals output from the sensors are converted by an AD (analog-to-digital) conversion circuit into digital data, which are input to the microcomputer. Sensor data which are bases of various kinds of control are required to be of high precision and the AD conversion accuracy is also required to be considerably high. For example, input and output voltages of batteries and motors used in electric vehicles and hybrid cars are up to several hundreds of volts. It is required to measure such a voltage with an error of several percent (e.g., 2%) or less and convert it into digital data.

Major factors that cause AD conversion errors include a characteristic of the AD conversion circuit and a variation of a power source voltage supplied to the AD conversion circuit. The error due to the characteristic of the AD conversion circuit is what is called a quantization error and generally measures ±1 to 3 LSBs. For example, in an AD conversion circuit having a resolution 10 bits and a reference voltage 5 V, an error of ±3 LSBs corresponds to ±14.7 mV, which means an error of about 1.47% when a voltage 1 V is measured.

Usually, AD conversion circuits quantize an input analog voltage using a unit voltage obtained by dividing a power source voltage or a reference voltage according to a resolution. Therefore, a variation of the power source voltage is reflected in a measurement value. For example, a power source voltage that is supplied to an AD conversion circuit used in a vehicle from a vehicular voltage regulator has a variation of about ±2%, and hence an output measurement value of the AD conversion circuit may also have an error of about ±2%.

In order to reduce the influence of such errors, conventionally, various methods for correcting an error of an AD conversion circuit have been proposed (refer to Patent documents 1 and 2, for example).

Patent document 1: JP-A-06-204868
Patent document 2: JP-A-2005-244771

In the AD conversion circuit disclosed in Patent document 1, a correction reference analog voltage is input to the AD conversion circuit and an AD conversion error is determined on the basis of a value obtained by converting the correction reference analog voltage into digital data and stored. When an input analog voltage is converted into digital data, the digital data is corrected by shifting it by the stored AD conversion error. In the AD conversion circuit disclosed in Patent document 2, correction values corresponding to respective input voltages are stored in a memory in advance and digital data produced by converting an input analog voltage is corrected using a corresponding correction value.

However, the above conventional methods have limits in the accuracy of AD conversion error correction and have difficulty increasing the correction accuracy further. More specifically, since errors due to the characteristic of an AD conversion circuit are not uniform in a voltage measurement range, errors remain when a single correction value is applied over the entire measurement range. One method for correcting an error due to the characteristic of an AD conversion circuit with high accuracy is to divide the measurement range into plural divisional ranges and store plural correction values for the respective divisional ranges. However, this method is not realistic because it is not easy to prepare a number of correction values and storing plural correction values and selecting from them results in increase in processing load.

Even if an error due to the characteristic of an AD conversion circuit can be corrected successfully, an error due to a variation of a power source voltage supplied to the AD conversion circuit cannot be corrected completely by, for example, the offsetting method using a correction value prepared in advance because it is difficult to predict a variation of the power source voltage. One method for correcting an error due to a variation of the power source voltage is to supply a highly accurate power source voltage to an AD conversion circuit. However, this method is not practical because implementing a high-accuracy power source together with an AD conversion circuit increases the cost and complicates the device configuration. In addition, since a high-accuracy power source is restricted in output current, it cannot supply power to peripheral circuits of the AD conversion circuit and hence it is inevitable to use a power source for the peripheral circuits in addition to the high-accuracy power source. It is therefore necessary to, for example, control the power supply start/stop timing of the power source for the peripheral circuits and the high-accuracy power source. As such, this method is low in practicality. As described above, the conventional methods have limits in the accuracy of AD conversion error correction and a practical method capable of increasing the correction accuracy further is desired.

SUMMARY OF THE INVENTION

One or more embodiments of the invention provide an AD conversion circuit and an error correcting method which can correct an AD conversion error reliably and convert an analog signal into digital data with high accuracy.

In accordance with one or more embodiments of the invention, an AD conversion circuit 10 that converts an input analog signal Vin into digital data XVin and corrects an error of the digital data XVin may include: an AD converting section 15 adapted to receive the analog signal Vin, a power source voltage Vcc, and a reference voltage Vref, and to AD-convert the analog signal Vin and the reference voltage Vref using the power source voltage Vcc; and a correction processing section 13 adapted to correct a conversion value which is output by the AD converting section 15. The correction processing section 13 may be adapted to: calculate a voltage variation $\Delta Vcc$ of the power source voltage Vcc of an ordinary operation based on a first conversion value Xref_ideal obtained by AD-converting the reference voltage Vref by the AD converting section 13 in a state that a standard power source voltage Vcc including no voltage variation is supplied to the AD converting section and a second conversion value Xref_real obtained by AD-converting the reference voltage Vref by the AD converting section 13 in a state that the power source voltage Vcc of the ordinary operation is supplied to the AD converting section 13; and correct, using the calculated voltage variation $\Delta Vcc$, a third conversion value XVin produced by AD-converting the analog signal Vin by the AD converting section 15 in a state that the power source voltage Vcc for the ordinary operation is supplied to the AD converting section 15.

Other aspects and advantages of the invention will be apparent from the following description and the appended claims.

DETAILED DESCRIPTION OF THE EXEMPLARY EMBODIMENTS

An exemplary embodiment of the present invention will be hereinafter described with reference to the drawings.

Figure 1:
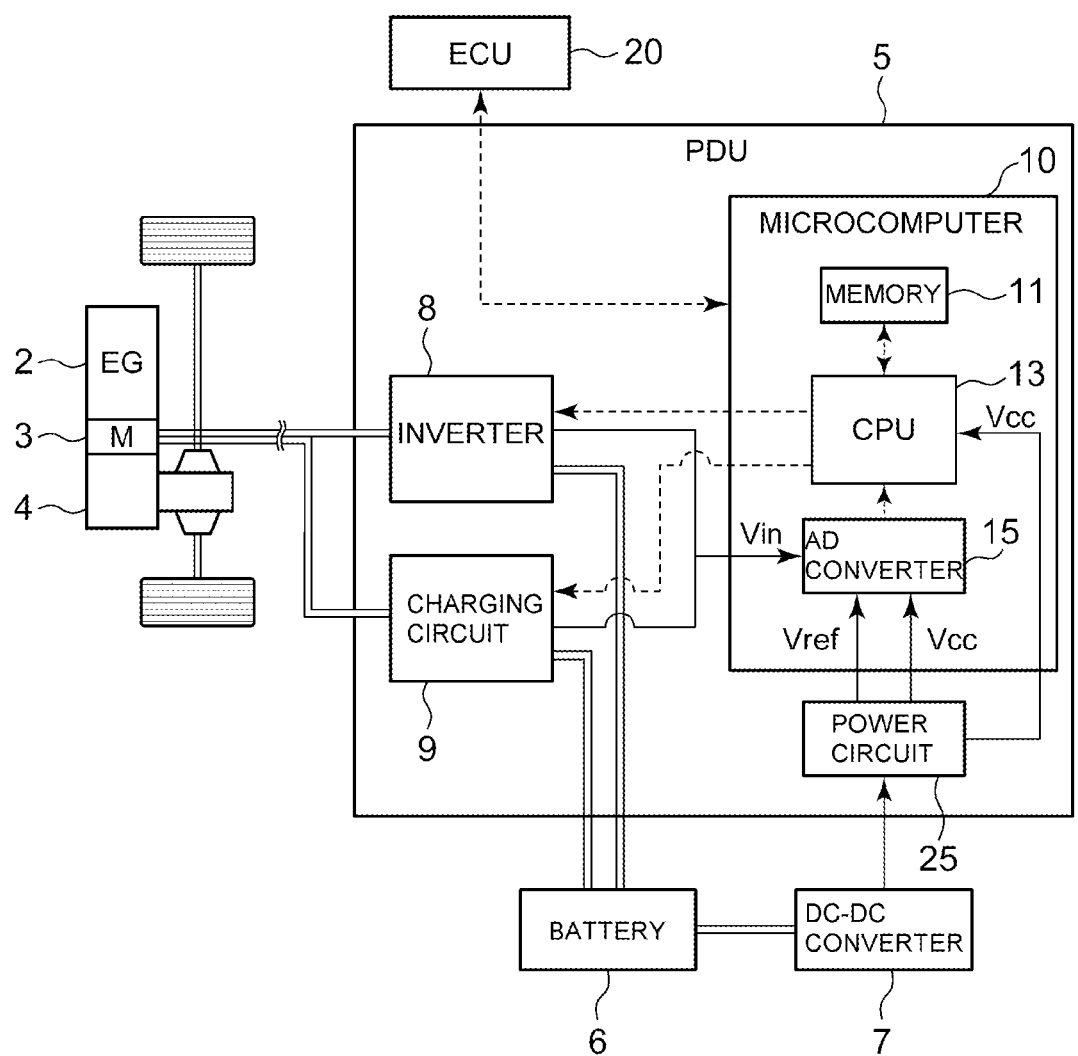
FIG. 1 is a block diagram showing a configuration of a PDU and its peripheral circuits of an exemplary embodiment.

FIG. 1 is a block diagram showing a general configuration of a hybrid car according to the exemplary embodiment of the invention. In FIG. 1, solid lines represent power supply lines and broken lines represent control signal lines.

The hybrid car shown in FIG. 1 is a car which runs with its axle driven by a driving system which is equipped with an engine 2, a motor 3, and an automatic transmission 4. The motor 3 is connected to a battery 6 via a PDU (Power Drive Unit) 5.

The motor 3 is driven by three-phase AC currents that are supplied from the PDU 5 (described later). The output shaft of the motor 3 is connected to the crank shaft of the engine 2. The motive power of the motor 3 starts the engine 2, and assists the drive power of the engine 2 while the car is running. During deceleration, for example, the motor 3 functions as a generator which regenerates electric energy from rotation energy of the crank shaft. The PDU 5 charges the battery 6 using electric power thus generated by the motor 3.

A gear shift operation of the automatic transmission 4 is controlled in such a manner that plural synchronous clutches are driven being controlled through hydraulic controls by an ECU (Electric Control Unit) 20. Drive power of the engine 2 and the motor 3 is transmitted to the right and left drive wheels through the automatic transmission 4.

The PDU 5 is equipped with an inverter 8 for converting DC power that is supplied from the battery 6 into AC power, a charging circuit 9 for converting AC power generated by the motor 3 into DC power having a prescribed voltage through voltage transformation and rectification and charging the battery by the thus-produced DC power, a microcomputer 10 for controlling the inverter 8 and the charging circuit 9 under the control of the ECU 20 of the car, and a power circuit 25 for supplying power to the microcomputer 10.

The inverter 8 incorporates a switching power circuit for converting DC power that is supplied from the battery 6 into three-phase (U, V, and W) AC power under the control of the microcomputer 10. With this configuration, the motive power of the motor 3 is PWM-controlled by the microcomputer 10.

The charging circuit 9 charges the battery 6 by outputting, to the battery 6, DC power produced by performing rectification and voltage transformation on power generated by the motor 3.

The battery 6 has plural secondary batteries such as nickel-hydrogen secondary batteries or lithium ion secondary batteries that are connected to each other in series and/or parallel, and is equipped with, among other circuits, a protective circuit for detecting a balance abnormality, an excessive discharge, excessive charging, etc. of each secondary battery by detecting the voltage across the two terminals of each secondary battery.

A DC-DC converter 7 for converting the voltage of DC power generated by discharge of the battery 6 is connected to the battery 6. For example, the DC-DC converter 7 lowers the voltage (100 V) of DC power that is output from the battery 6 to 12 V and supplies resulting power to control devices and auxiliary devices of the car. Also the microcomputer 10 of the PDU 5 is supplied with power from the DC-DC converter 7.

The microcomputer 10 (AD conversion circuit) is equipped with an AD converter 15 (AD converting section) for converting, into digital data, analog voltages to be monitored for pieces of control performed by the microcomputer 10 and outputting the thus-produced digital data, a CPU 13 (correction processing circuit) for controlling the inverter 8 and the charging circuit 9 on the basis of the digital data that are output from the AD converter 15, and a memory 11 (storage unit) for storing data etc. to be processed by the CPU 13. The power circuit 25, which is mounted on a board of the PDU 5 together with the microcomputer 10, is connected to the microcomputer 10 and supplies the microcomputer 10 with a power source voltage Vcc and a reference voltage Vref. The CPU 13 and the AD converter 15 of the microcomputer 10 operate on the power source voltage Vcc which is supplied from the power circuit 25, and the AD converter 15 performs AD conversion (described later) using, as a reference, the reference voltage Vref which is supplied from the power circuit 25. The following description will be made with an assumption that the resolution of the AD converter 15 is 10 bits (just an example).

The CPU 13 performs processing of correcting an error of digital data that is input from the AD converter 15, that is, an error due to the characteristic of the AD converter 15 and an error due to a variation of the power source voltage Vcc of the power circuit 25, and controls the inverter 8 and the charging circuit 9 on the basis of corrected digital data.

The voltages to be monitored by the CPU 13 to control the inverter 8 and the charging circuit 9 are the input voltage that is input from the battery 6 to the inverter 8, the output voltage of the charging circuit 9 which is produced on the basis of power generated by the motor 3, and other voltages. As shown in FIG. 1, each of these voltages is input to the microcomputer 10 as an input voltage Vin and the AD converter 15 outputs digital data by quantizing the input voltage Vin.

Each input voltage Vin that is input to the microcomputer 10 is not a monitoring subject voltage itself, that is, not the input voltage itself that is input from the battery 6 to the inverter 8 or the output voltage itself of the charging circuit 9 which is produced on the basis of power generated by the motor 3. Each monitoring subject voltage is input to the microcomputer 10 as an input voltage Vin after being voltage-divided by a voltage division circuit (not shown) provided outside the microcomputer 10 into a voltage that is within a rated range of the microcomputer 10.

The DC-DC converter 7 is connected to the battery 6. The DC-DC converter 7 lowers the voltage of DC power that is output from the battery 6 to 14 V (DC), which is supplied to individual units of the car. The power circuit 25 of the PDU 5 generates the power source voltage Vcc and the reference voltage Vref by smoothing and transforming the DC voltage that is input from the DC-DC converter 7.

Incidentally, the output voltage of the battery 6 varies depending on or due to the residual capacity of the battery 6, aging variations and a load variation the battery 6, the temperature of the battery 6, and other factors. The load variation of the battery 6 depends on the operation state of the motor 3 (i.e., whether the motor 3 is generating electric power through regeneration of energy or the car is being driven using power generated by the battery 6) and the operation states of auxiliary devices of the car such as the blower fan of an air conditioner. The temperature of the battery 6 not only becomes high during a discharge and charging but also is influenced by the ambient temperature of the car. For example, the temperature of the battery 6 may be below 0° C. when a cold start is done in a cold season, and reach 60° C. when the ambient temperature is high. As mentioned above, the battery 6 has secondary batteries such as nickel-hydrogen secondary batteries or lithium ion secondary batteries. In general, the charging/discharging efficiency of these kinds of secondary batteries lowers when their temperature is high. Therefore, the output voltage of the battery 6 is prone to be influenced by its temperature.

As described above, the output voltage of the battery 6 is prone to vary because its characteristics depend on its use conditions in the car and hence the power source voltage Vcc and the reference voltage Vref of the power circuit 25 which is supplied with power from the battery 6 are also varied by the above factors.

In view of the above, in the exemplary embodiment, the CPU 13 efficiently corrects output digital data of the AD converter 15 for both of an error due to a variation of the power source voltage Vcc of the AD converter 15 and an error due to the characteristic of the AD converter 15, whereby highly accurate digital data is obtained. Methods for realizing such corrections will be described below.

A measurement subject voltage that is input to the AD converter 15 is called an input voltage Vin and a variable component of the power source voltage Vcc which is input to the AD converter 15 is called a voltage variation $\Delta Vcc$. As mentioned above, the resolution of the AD converter 15 is assumed to be 10 bits. The AD converter 15 converts an input voltage Vin into digital data with the power source voltage Vcc as a full scale of 10 bits, and outputs an AD conversion value X. The AD conversion value X is given by the following Equation (1"):

$$X = Vin \times 2^{10}/Vcc \qquad (1")$$

Where the power source voltage Vcc in Equation (1") a voltage that is supplied for ordinary operation, it includes a voltage variation $\Delta Vcc$ and hence can be expressed as $Vcc+\Delta Vcc$. Therefore, an AD conversion value X in ordinary operation is given by the following Equation (1'):

$$X = Vin \times 2^{10}/(Vcc+\Delta Vcc) \qquad (1')$$

Since $\Delta Vcc$ can be either of a positive value and a negative value, naturally the power source voltage ($Vcc+\Delta Vcc$) for the ordinary operation may vary downward and become lower than a standard power source voltage Vcc.

In the exemplary embodiment, as described later, the CPU 13 has a function of calculating the voltage variation $\Delta Vcc$ (a calculated voltage variation is represented by $\Delta Vcc\_calc$).

The output AD conversion value X of the AD converter 15 is given by the following Equation (1):

$$X = Vin \times 2^{10}/(Vcc+\Delta Vcc\_calc) \qquad (1)$$

Therefore, the error in the AD conversion value X due to the voltage variation can be corrected for by using $\Delta Vcc\_calc$ calculated by the CPU 13.

In the microcomputer 10, an AD conversion value X (represented by Xref_ideal) that is obtained when the reference voltage Vref is measured by the AD converter 15 in a state that the AD converter 15 is supplied with an ideal power source voltage with no voltage variation $\Delta Vcc$ (that is, standard power source voltage Vcc) is stored in the memory 11 as a presetting.

The AD conversion value Xref_ideal may be determined by an actual measurement by connecting, to the AD converter 15, a constant voltage source that is so accurate as to be regarded as outputting an ideal power source voltage Vcc and supplying the AD converter 15 with a reference voltage Vref that is likewise highly accurate. Alternatively, the value Xref_ideal can be calculated from a specification of the power circuit 25 which supplies the power source voltage Vcc and the reference voltage Vref to the microcomputer 10. A standard voltage and a variation range of the output voltage of electronic components such as regulators constituting the power circuit 25 are prescribed in its specification. The value Xref_ideal can be calculated according to the following Equation (2) using the standard output voltage values of regulators that respectively output the power source voltage and the reference voltage as the standard power source voltage Vcc and the standard reference voltage Vref in Equation (2). The AD conversion value Xref_ideal thus calculated corresponds to a first conversion value.

$$Xref\_ideal = Vref \times 2^{10}/Vcc \qquad (2)$$

where $2^{10}$ (=1024) is a decimal number corresponding to the resolution 10 bits of the AD converter 15.

After the presetting, a reference voltage Vref that is actually input from the power circuit 25 is measured by the AD converter 15. An AD conversion value Xref_real thus measured is given by the following Equation (3), and corresponds to a second conversion value.

$$Xref\_real = Vref \times 2^{10}/(Vcc+\Delta Vcc) \qquad (3)$$

The CPU 13 compares the AD conversion value Xref_ideal corresponding to the ideal power source voltage Vcc (standard power source voltage) with the AD conversion value Xref_real that has been obtained with the supply of the ordinary power source voltage according to the following Equation (4) and calculates the voltage variation $\Delta Vcc$ from Equation (4):

$$Xref\_real/Xref\_ideal = (Vcc+\Delta Vcc)/Vcc \qquad (4)$$

Since the value of the standard power source voltage Vcc, that is, the value of Vcc in Equation (4), is known, the voltage variation $\Delta Vcc\_calc$ can be calculated according to the following Equation (5) which is a modified version of Equation (4):

$$\Delta Vcc\_calc \approx \Delta Vcc = Vcc \times \{Xref\_real/Xref\_ideal - 1\} \qquad (5)$$

Next, a description will be made of a procedure for correcting an AD conversion value XVin that is digital data obtained by converting an input voltage Vin by the AD converter 15 in the PDU 5 provided in the car (see FIG. 1).

An AD conversion value XVin is measured as expressed by the following Equation (6), and corresponds to a third conversion value.

$$XVin = Vin \times 2^{10}/(Vcc+\Delta Vcc) \qquad (6)$$

The following Equation (7) of the input voltage Vin is obtained from Equation (6):

$$Vin = XVin \times (Vcc+\Delta Vcc)/2^{10} \qquad (7)$$

The following Equations (8) and (9) hold which include an AD conversion value XVin' which is obtained by correcting an error due to the voltage variation ΔVcc using the voltage variation ΔVcc_calc which is calculated by Equation (5):

$$Vin = XVin' \times Vcc/2^{10} \quad (8)$$

$$XVin' = XVin \times Vcc/(Vcc + \Delta Vcc) \quad (9)$$

XVin' can be calculated according to the following Equation (10) which is a modified version of Equation (9):

$$XVin' \cong XVin \times Vcc/(Vcc + \Delta Vcc\_calc) \quad (10)$$

The error-corrected AD conversion value XVin' which is calculated according to Equation (10) includes an error due to the AD conversion characteristic of the AD converter 15. Consideration will be given to this error using the following Equations (11)-(16).

[Formulae 1]

$$\begin{aligned}
XVin' &= XVin \times Vcc/(Vcc + \Delta Vcc\_calc) & (11) \\
&= XVin \times Xref\_ideal/Xref\_real & (12) \\
&= \{XVin/Xref\_real\} \times Xref\_ideal & (13) \\
&= \frac{Vin \times \left(\frac{2^{10}}{Vcc + \Delta Vcc} \pm \Delta X\right)}{Vref \times \left(\frac{2^{10}}{Vcc + \Delta Vcc} \pm \Delta X\right)} \times Vref \times \frac{2^{10}}{Vcc} & (14) \\
&= (Vin/Vref) \times Vref \times (2^{10}/Vcc) & (15) \\
XVin' &= Vin \times 2^{10}/Vcc & (16)
\end{aligned}$$

Equations (11)-(13) are obtained by modifying Equation (10) for calculating the AD conversion value XVin' which is obtained by correcting an error due to the voltage variation ΔVcc.

The AD conversion values XVin and Xref_real in Equation (13) each include an error ΔX due to the AD conversion characteristic of the AD converter 15 and hence are given by the following Equations (17) and (18) which are obtained by adding ΔX to Equations (6) and (3), respectively:

$$XVin = Vin \times \{2^{10}/(Vcc + \Delta Vcc) \pm \Delta X\} \quad (17)$$

$$Xref\_real = Vref \times \{2^{10}/(Vcc + \Delta Vcc) \pm \Delta X\} \quad (18)$$

On the other hand, the ideal value Xref_ideal does not include ΔX and is given by Equation (2).

Equation (14) is obtained by substituting Equations (17), (18), and (2) into Equation (13).

The terms $\{2^{10}/(Vcc+\Delta Vcc) \pm \Delta X\}$ cancel out each other as seen from Equation (15), whereby Equation (16) is obtained. The AD conversion value XVin' of Equation (16) does not include the error ΔX due to the AD conversion characteristic.

Equation (16) is a modified version of Equation (8). That is, as seen from the above-described process for deriving Equation (16), not only does the AD conversion value XVin' calculated by Equation (8) not include the voltage variation ΔVcc but also the error ΔX is eliminated in the process of calculation. Therefore, when an output value of the AD converter 15 is corrected according to Equation (10) which is obtained from Equation (8), an error due to the AD conversion characteristic is corrected together with an error due to a voltage variation Vcc of the AD converter 15, whereby a highly accurate AD conversion value can be obtained.

Furthermore, no limitations are imposed on the value of the reference voltage Vref. Therefore, the accuracy of an AD conversion value of a measurement subject input voltage Vin can be increased by setting the reference voltage Vref close to the input voltage Vin.

More specifically, if there exists a voltage value (represented by Vin_acc) that is required to be highest in accuracy in a range of input voltages Vin, the PDU 5 is configured so that the reference voltage Vref becomes equal to the voltage value Vin_acc by adjusting the specification of the power circuit 25 and other factors. In this case, a relationship (reference voltage Vref)=(input voltage Vin)=Vin_acc is established and hence Equation (15) is modified into the following Equation (19):

[Formula 2]

$$XVin' = (Vin\_acc/Vin\_acc) \times Vin\_acc \times (2^{10}/Vcc) = Vin\_acc \times 2^{10}/Vcc \quad (19)$$

Equation (19) include no terms including the voltage variation ΔVcc or the error ΔX of the AD conversion value and includes, as variables, only the voltage Vin_acc and the standard power source voltage Vcc which does not include a variable component. The setting method in which as described above the reference voltage Vref is set equal or close to the voltage value Vin_acc makes it possible to determine, with highest accuracy, an AD conversion value of the voltage value Vin_acc which is required to be highest in accuracy. This provides an advantage that an AD conversion value XVin of an input voltage Vin can likewise be determined with high accuracy even if the reference voltage Vref is not equal to the voltage value Vin_acc which is required to be highest in accuracy, that is, as long as the reference voltage Vref is within or close to the range of the input voltage Vin.

A description will now be made of a process for determining an AD conversion value as error-corrected by the microcomputer 10 in a state that the PDU 5 is actually incorporated in the car.

Figure 2:
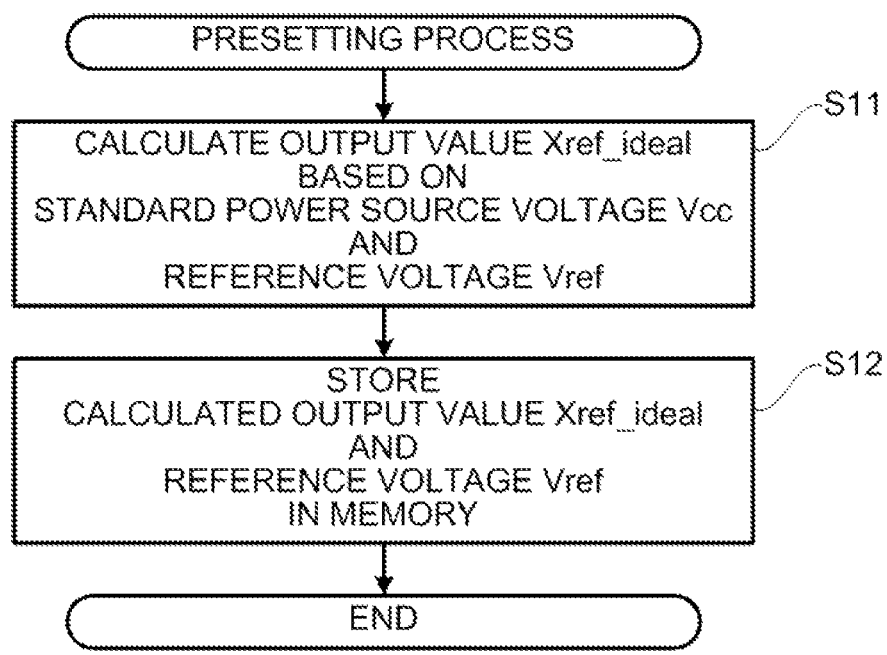
FIG. 2 is a flowchart of a presetting process.

FIG. 2 is a flowchart of a presetting process for setting necessary pieces of information in the microcomputer 10 in advance.

In this presetting process, at step S11, an output value Xref_ideal of the AD converter 15 that should be obtained when an ideal power source voltage (standard power source voltage) Vcc and an ideal reference voltage (standard reference voltage) Vref are input to the microcomputer 10 is calculated on the basis of the specifications of components such as regulators that constitute the power circuit 25. At step S12, the calculated output value Xref_ideal and the reference voltage value Vref are stored in the memory 11. The output value Xref_ideal stored in the memory 11 will be used in the following calculation process.

Instead of executing the above-described presetting process, an output value Xref_ideal may be measured actually by the AD converter 15 in a state that a constant voltage source that is so accurate as to be regarded as outputting an ideal power source voltage Vcc is connected to the AD converter 15 of the microcomputer 10 and the standard power source voltage Vcc is supplied from this constant voltage source to the AD converter 15 and a reference voltage Vref that is likewise highly accurate is also supplied to the AD converter 15. In this case, a measurement value Xref_ideal thus measured and the reference voltage value Vref are stored in the memory 11 so as to be correlated with each other.

As a result of the execution of the presetting process, the memory 11 is stored with the AD conversion value Xref_ideal and the reference voltage Vref which are necessary for the calculation of Equations (3)-(5).

Figure 3:
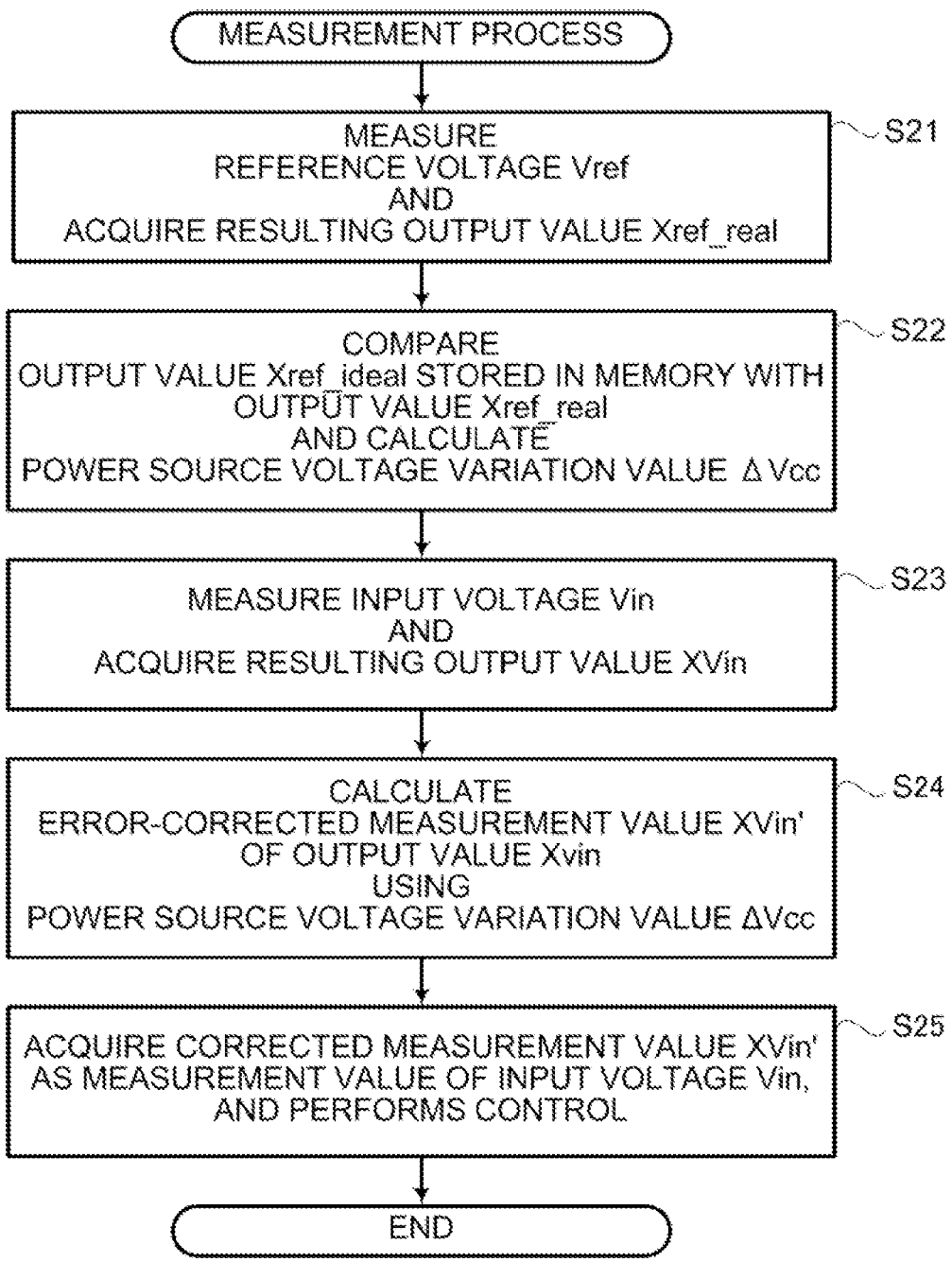
FIG. 3 is a flowchart of a voltage measurement process.

FIG. 3 is a flowchart of a measurement process that the AD converter 15 of the microcomputer 10 measures an analog voltage value actually. This process is executed in a state that the power source voltage (Vcc) and the reference voltage Vref are being supplied to the microcomputer 10 from the power circuit 25 (see FIG. 1).

First, at step S21, the AD converter 15 measures the reference voltage Vref under the control of the CPU 13 and the CPU 13 acquires a resulting AD conversion value Xref_real.

At step S22, the CPU 13 compares the AD conversion value Xref_ideal that was stored in the memory 11 in the presetting process with the AD conversion value Xref_real that was output from the AD converter 15 at step S21, and calculates a voltage variation ΔVcc according to Equations (3)-(5).

At step S23, the AD converter 15 measures an input voltage Vin and the CPU 13 acquires a resulting AD conversion value XVin.

At step S24, the CPU 13 calculates a corrected AD conversion value XVin' according to Equation (10) using the voltage variation ΔVcc that was calculated at step S22.

The following Equation (20) is obtained by substituting Equation (4) into Equation (9). A corrected AD conversion value XVin' may be calculated according to Equation (20):

$$XVin' = XVin \times Xref\_real / Xref\_ideal \quad (20)$$

A further alternative is possible in which values of Xref_real/Xref_ideal are determined for plural combinations of a value Xref_real and a value Xref_ideal and these values are stored in the memory 11 in the form of a map in advance.

In this case, a corrected AD conversion value XVin' can be determined quickly after acquisition of a value Xref_real and a value Xref_ideal, without the need for calculating Xref_real/Xref_ideal actually. The processing load can be reduced greatly and the processing speed and the operation efficiency of the microcomputer 10 can be increased.

Returning to FIG. 3, at step S25, the CPU 13 acquires the corrected AD conversion value XVin' as a measurement value of the input voltage Vin and controls the inverter 8 and the charging circuit 9 on the basis of this AD conversion value XVin'.

Figure 4:
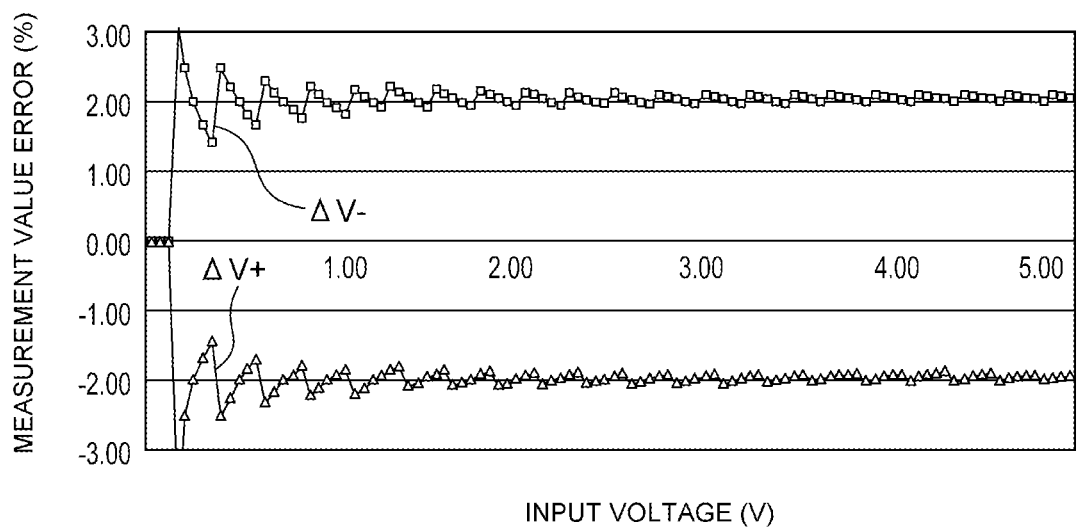
FIG. 4 is a graph showing specific examples of errors of AD conversion values for input voltages.
Figure 5:
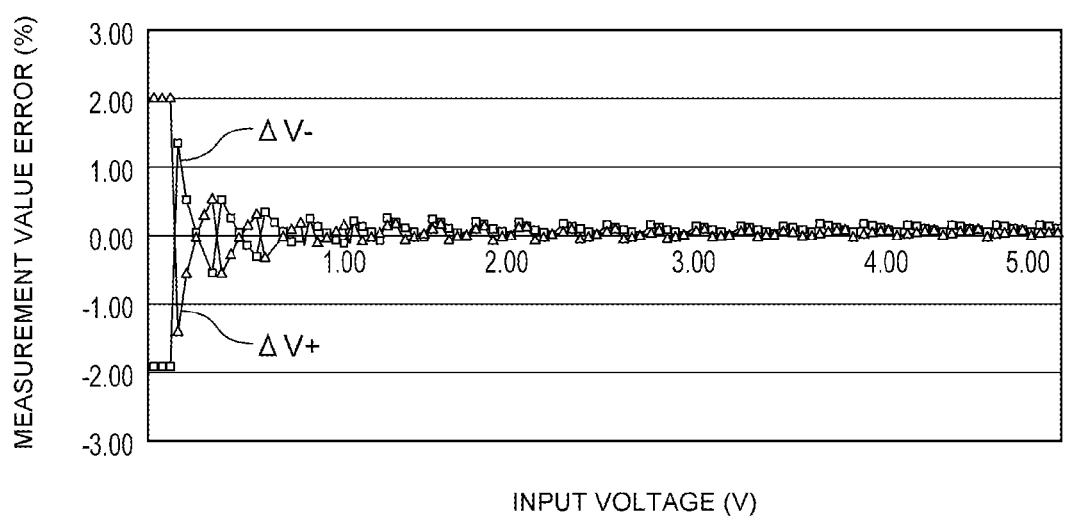
FIG. 5 is a graph showing errors after correction of the AD conversion values of FIG. 4.

FIG. 4 is a graph showing specific examples of errors of AD conversion values X for input voltages Vin. FIG. 5 is a graph showing errors after correction of the AD conversion values X of FIG. 4. In FIGS. 4 and 5, the horizontal axis represents the input voltage Vin (V) and the vertical axis represents the ratio (%) of the voltage corresponding to the error with respect to the input voltage Vin. The error is the difference between digital data acquired by the CPU 13 of the microcomputer 10 (see FIG. 1) as a measurement value of an input voltage Vin and the actual value of the input voltage Vin. Digital data acquired by the CPU 13 may be higher (ΔV+) or lower (ΔV−) than an actual input voltage Vin depending on an error. Therefore, each of FIGS. 4 and 5 show higher-voltage errors and lower-voltage errors.

As shown in FIG. 4, before the error correction, extremely large errors occur when input voltages Vin are low. Approximately constant errors (about 2% on each of the positive side and the negative side) occur even for input voltages Vin that are larger than 1 V. When the power source voltage Vcc has voltage variations ΔVcc of ±2%, the voltage variations ΔVcc cause AD conversion values to also have errors of ±2%. Therefore, when the input voltage Vin is high, an error voltage value is not negligible.

In contrast, errors due to voltage variations ΔVcc are eliminated almost completely from corrected AD conversion values. More specifically, although certain errors remain when input voltages Vin are lower than 1 V, errors are reduced to almost 0% on each of the positive side and the negative side for input voltages Vin that are larger than 1 V. It can be said that an error of an AD conversion value due to a voltage variation ΔVcc can be corrected almost completely.

Figure 6:
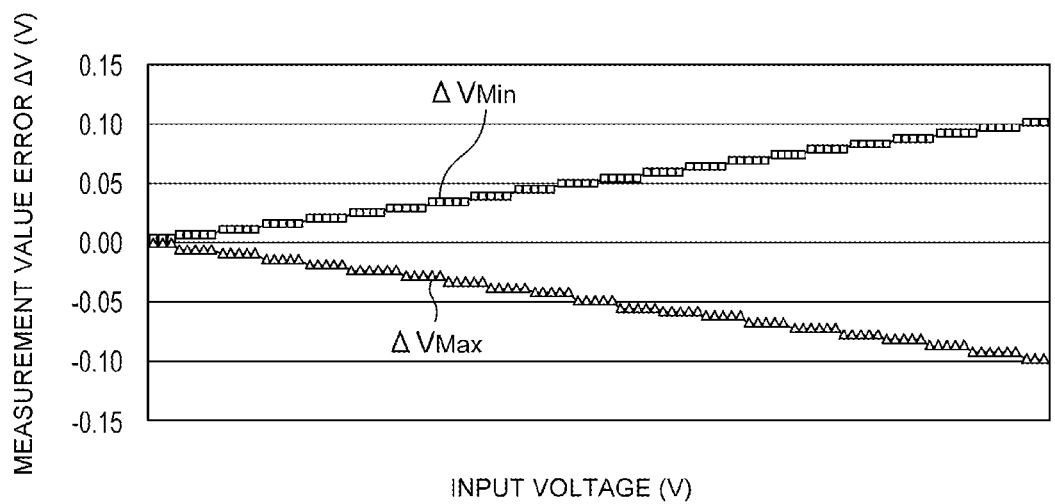
FIG. 6 is a graph showing another set of specific examples of errors of AD conversion values for input voltages.
Figure 7:
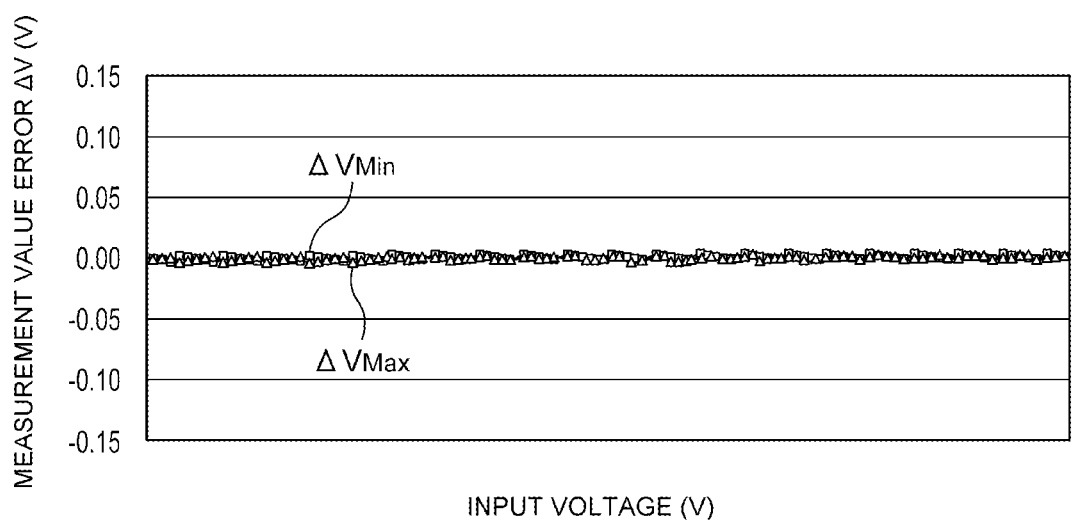
FIG. 7 is a graph showing errors after correction of the AD conversion values of FIG. 6.

FIG. 6 is a graph showing another set of specific examples of errors of AD conversion values X for input voltages Vin. FIG. 7 is a graph showing errors after correction of the AD conversion values X of FIG. 7. In each of FIGS. 6 and 7, errors (ΔVMin) that occur when the power source voltage Vcc for the AD converter 15 is lowest in its range corresponding to the variation range of a voltage variation ΔVcc and errors (ΔVMax) that occur when the power source voltage Vcc is highest in its variation range are shown separately. The horizontal axis represents the input voltage Vin (V) and the vertical axis represents the voltage (V) corresponding to the error with respect to the input voltage Vin. The errors shown in each of FIGS. 6 and 7 are errors that occur when the power source voltage Vcc is fixed and hence are due to the AD conversion characteristic of the AD converter 15.

As shown in FIG. 6, the error due to the AD conversion characteristic of the AD converter 15 increases as the input voltage Vin increases in each of the case that the power source voltage Vcc is high and the case that the power source voltage Vcc is low in contrast, after the correction which is performed in the above-described manner, errors are very small irrespective of the magnitude of the input voltage Vin. This is because an error is canceled out through calculation instead of being corrected by, for example, shifting an AD conversion value by a value corresponding to a variation.

As described above, the microcomputer 10 according to the exemplary embodiment of the invention which converts an input voltage Vin into digital data and corrects an error of the digital data is equipped with the AD converter 15 for receiving the input voltage Vin, a power source voltage, and a reference voltage Vref, AD-converting each of the input voltage Vin and the reference voltage Vref using the power source voltage, and outputting a resulting conversion value; and the CPU 13 for correcting the output conversion value of the AD converter 15. The CPU 13 calculates a voltage variation ΔVcc of a power source voltage for ordinary operation on the basis of an AD conversion value Xref_ideal obtained by AD-converting the reference voltage Vref by the AD converter 15 in a state that a standard power source voltage Vcc including no voltage variation ΔVcc is supplied to the AD converter 15 and an AD conversion value Xref_real obtained by AD-converting the reference voltage Vref by the AD converter 15 in a state that the power source voltage for ordinary operation is supplied to the AD converting section.

The CPU 13 corrects, using the calculated voltage variation ΔVcc, an AD conversion value produced by AD-converting the input voltage Vin by the AD converter 15 in a state that the power source voltage for ordinary operation is supplied to the AD converter 15. Therefore, an error due to a variation of the power source voltage of the AD converter 15 can be corrected reliably and an error due to its AD conversion characteristic can also be corrected simultaneously. More specifically, since a voltage variation ΔVcc of a power source voltage is calculated in such a manner as to include an error due to the AD conversion characteristic and an AD conversion value is corrected using the calculated voltage variation ΔVcc, an error due to the AD conversion characteristic that is included in the AD conversion error is canceled out by the same error included in the voltage variation ΔVcc. In this manner, the error due to the voltage variation ΔVcc and the error due to the AD conversion characteristic can be corrected together. As a result, an error of digital data produced by AD-converting an input voltage Vin can be corrected reliably and AD conversion can be performed with even higher accuracy by the practical method that does not cause, for example, complication of the circuit configuration.

The AD conversion value Xref_ideal obtained by AD-converting the reference voltage Vref by the AD converter 15 in the state that the standard power source voltage Vcc is supplied to the AD converter 15 and the reference voltage Vref that was used in determining the AD conversion value Xref_ideal are stored in the memory 11 in such a manner as to be correlated with each other. The CPU 13 calculates a voltage variation $\Delta$Vcc using the AD conversion value Xref_ideal stored in the memory 11. Therefore, a voltage variation $\Delta$Vcc can be calculated quickly using the AD conversion value Xref_ideal stored in advance, and an error of an AD conversion value can be corrected quickly and accurately and AD conversion can be performed with even higher accuracy.

The CPU 13 can quickly calculate, according to Equation (5) (Equation (A)), a voltage variation $\Delta$Vcc of the power source voltage for ordinary operation on the basis of the AD conversion value Xref_ideal obtained by AD-converting the reference voltage Vref by the AD converter 15 in the state that the standard power source voltage Vcc is supplied to the AD converter 15 and the AD conversion value Xref_real obtained by AD-converting the reference voltage Vref by the AD converter 15 in the state that the power source voltage for ordinary operation is supplied to the AD converting section:

$$\Delta Vcc\_calc \cong \Delta Vcc = Vcc \times \{Xref\_real/Xref\_ideal - 1\} \quad (5)$$

Furthermore, the AD converter 15 outputs an AD conversion value XVin by AD-converting the input voltage Vin by performing processing that is represented by Equation (6) in the state that the power source voltage Vcc+$\Delta$Vcc for ordinary operation is supplied to the AD converter 15:

$$XVin = Vin \times 2^{10}/(Vcc + \Delta Vcc) \quad (6)$$

The CPU 13 can quickly produce a corrected conversion value XVin' by correcting the AD conversion value XVin that is output from the AD converter 15 according to Equation (9) (Equation (C)) using the standard power source voltage Vcc and the voltage variation $\Delta$Vcc:

$$XVin' = XVin \times Vcc/(Vcc + \Delta Vcc) \quad (9)$$

Equation (6) can be modified into the following Equation (B):

$$XVin = Vin \times 2^R/(Vcc + \Delta Vcc)$$

where R is the number of bits representing a resolution of the AD converter 15.

The AD converter 15 of the microcomputer 10 which is incorporated in the hybrid car is used in such a state that the power source voltage Vcc that is supplied from the battery 6 to the AD converter is prone to vary depending on the environments of various units including the battery 6 and the operation states of various loads including the motor 3. As described above, since the CPU 13 corrects, reliably and quickly, an error due to a variation of the power source voltage Vcc for the AD converter 15, AD conversion can be performed with high accuracy and the inverter 8 and the charging circuit 9 can be controlled accurately even under severe conditions. An error due to the AD conversion characteristic can be corrected through a calculation for correcting a voltage variation of the power source voltage Vcc, which makes it possible to perform AD conversion with even higher accuracy. Since a calculation for correcting an error is performed using an AD conversion value Xref_ideal that is stored in the memory 11 in advance, it is not necessary to connect, to the AD converter 15, a high-accuracy standard voltage source with only a small voltage variation. In particular, where an AD conversion value Xref_ideal that should be produced in a state that a standard power source voltage Vcc is supplied to the AD converter 15 is calculated on the basis of the specifications of components such as the regulators constituting the power circuit 25 and is stored in the memory 11 in advance, it is not necessary to use a high-accuracy power source even in presetting and hence the accuracy of AD conversion can be increased without the need for using a complex device configuration.

Although the exemplary embodiment assumes that the resolution of the AD converter 15 is 10 bits, the invention is not limited to such a case. The resolution of the AD converter 15 may naturally be 8 bits, 16 bits, or some other value, and can be changed arbitrarily like the other specifications of the microcomputer 10. Although in the exemplary embodiment a voltage variation $\Delta$Vcc is calculated on the basis of a conversion value obtained by the AD converter 15's converting the reference voltage Vref which is always supplied to the AD converter 15 and a conversion value that is stored in the memory 11, the invention is not limited to such a case. For example, a reference voltage Vref for that purpose may be input to the AD converter 15 only when necessary or input to the AD converter 15 from the CPU 13. The values of the power source voltage Vcc and the reference voltage Vref can be changed arbitrarily according to the specification of the microcomputer 10. Although in the exemplary embodiment digital data that is a conversion value of the AD converter 15 is corrected by the CPU 13 of the microcomputer 10 which is provided in the PDU 5, the invention is not limited to such a case. For example, a configuration is possible in which digital data that is output from the microcomputer 10 is corrected by the ECU 20. The connection forms of the inverter 8, the charging circuit 9, and the microcomputer 10 and the detailed configuration of circuits etc. for supplying power from the battery 6 to the microcomputer 10 can be changed arbitrarily without departing from the spirit and scope of the invention.

Although the exemplary embodiment is directed to the case that the invention is applied to the microcomputer 10 that is incorporated in the hybrid car, the invention is not limited to such a case. For example, the invention can also be applied to electric vehicles (EVs) and fuel cell vehicles (FCVs) as well as non-four-wheel vehicles in which a motor is driven by power that is supplied from a battery such as motorcycles and special vehicles.

The application range of the invention is not restricted to vehicles or particular apparatus, and the invention can be applied to any apparatus as long as they incorporate an AD converter and include a circuit for compensating for a variation of a power source voltage that is supplied to the AD converter. In particular, it is preferable to apply the invention to movable bodies or apparatus that incorporate a battery and in which a driving motive power source such as a motor is driven by power supplied from the battery and a circuit including an AD converter is supplied with power from the same battery as the driving motive power source is, because the power source voltage for the circuit including the AD converter is prone to vary depending on the operation state of the driving motive power source and the invention makes it possible to correct an error of an AD conversion value due to a variation of the power source voltage.

It is even preferable to apply the invention to such movable bodies or apparatus in which, in addition, the battery is charged by generated or regenerated power, because there are more factors that vary the power source voltage and the invention still makes it possible to correct an error of an AD conversion value due to a variation of the power source voltage.

According to the above exemplary embodiment, an AD conversion circuit 10 that converts an input analog signal Vin into digital data XVin and corrects an error of the digital data XVin may include: an AD converting section 15 adapted to receive the analog signal Vin, a power source voltage Vcc, and a reference voltage Vref, and to AD-convert the analog signal Vin and the reference voltage Vref using the power source voltage Vcc; and a correction processing section 13 adapted to correct a conversion value which is output by the AD converting section 15. The correction processing section 13 may be configured to calculate a voltage variation ΔVcc of the power source voltage Vcc of an ordinary operation based on a first conversion value Xref_ideal obtained by AD-converting the reference voltage Vref by the AD converting section 13 in a state that a standard power source voltage Vcc including no voltage variation is supplied to the AD converting section and a second conversion value Xref_real obtained by AD-converting the reference voltage Vref by the AD converting section 13 in a state that the power source voltage Vcc of the ordinary operation is supplied to the AD converting section 13; and correct, using the calculated voltage variation ΔVcc, a third conversion value XVin produced by AD-converting the analog signal Vin by the AD converting section 15 in a state that the power source voltage Vcc for the ordinary operation is supplied to the AD converting section 15.

In the above structure, a voltage variation of a power source voltage for ordinary operation is calculated on the basis of a first conversion value obtained by AD-converting the reference voltage in a state that a standard power source voltage including no voltage variation is supplied to the AD converting section and a second conversion value obtained by AD-converting the reference voltage in a state that the power source voltage for ordinary operation is supplied to the AD converting section.

A conversion value produced by AD-converting an analog signal is corrected using the calculated voltage variation. Therefore, an error due to a variation of the power source voltage of the AD converting section can be corrected reliably and an error due to its AD conversion characteristic can also be corrected simultaneously. More specifically, since a voltage variation of a power source voltage is calculated in such a manner as to include an error due to the AD conversion characteristic and a conversion value is corrected using the calculated voltage variation, an error due to the AD conversion characteristic that is included in the conversion error is canceled out by the same error included in the voltage variation. In this manner, the error due to the voltage variation and the error due to the AD conversion characteristic can be corrected together. As a result, an error of digital data produced by AD-converting an analog signal can be corrected reliably and AD conversion can be performed with even higher accuracy by the practical method that does not cause, for example, complication of the circuit configuration.

The above structure may further includes a storage unit 11 adapted to store the first conversion value Xref_ideal and the reference voltage Vref used in determining the first conversion value Xref_ideal. The correction processing section 13 may be adapted to calculate the voltage variation ΔVcc of the power source voltage Vcc for the ordinary operation based on the first conversion value Xref_ideal stored in the storage unit 11 and the second conversion value Xref_real obtained by AD-converting the reference voltage Vref by the AD converting section 15 in the state that the power source voltage Vcc for the ordinary operation is supplied to the AD converting section 15.

In this configuration, since a first conversion value obtained in a state that the standard power source voltage including no voltage variation is supplied to the AD converting section is stored, a voltage variation can be calculated as soon as a second conversion value is obtained. As a result, a voltage variation can be calculated quickly, and an error of digital data produced by AD-converting an analog signal can be corrected accurately using the calculated voltage variation and AD conversion can be performed with even higher accuracy.

In the above structure, the correction processing section 13 may be adapted to calculate the voltage variation ΔVcc of the power source voltage Vcc for the ordinary operation, according to an Equation A: $\Delta Vcc = Vcc \times \{Xref\_real/Xref\_ideal - 1\}$ ... A. (The voltage variation is ΔVcc, the power source voltage is Vcc, the first conversion value is Xref_ideal, and the second conversion value is Xref_real.)

In this configuration, a voltage variation of the power source voltage for ordinary operation can be calculated quickly on the basis of a first conversion value and a second conversion value obtained by AD-converting the reference voltage in a state that the power source voltage for ordinary operation is supplied to the AD converting section.

in the above structure, the AD converting section 15 may be adapted to output the third conversion value XVin according to an Equation B: $XVin = Vin \times 2^R/Vcc + \Delta Vcc$ ... B (The third conversion value is XVin, and a number of bits representing a resolution of the AD converting section is R.) The correction processing section 13 may produce a corrected conversion value XVin' by correcting the third conversion value XVin according to Equation C: $XVin' = XVin \times Vcc/Vcc + \Delta Vcc$ ... C. (The corrected conversion value is XVin')

In this configuration, a conversion value obtained by AD-converting an analog signal is corrected using the voltage variation ΔVcc of the power source voltage for ordinary operation. An error due to the AD conversion characteristic can also be corrected during the course of this correction. These corrections can be performed quickly by a simple calculation.

In the above structure, the reference voltage Vref may be set at a voltage value that is within or close to a range of the analog signal Vin.

In this configuration, since an input analog signal (conversion subject) is equal or close to the reference voltage with which the conversion accuracy is highest, the input analog signal can be AD-converted with very high accuracy like the reference voltage.

Moreover, according to the above exemplary embodiment, an output conversion value XVin may be corrected by: obtaining a first conversion value Xref_ideal of AD-converting the reference voltage Vref in a state that a standard power source voltage Vcc including no voltage variation is supplied to the AD converting section 15; obtaining a second conversion value Xref_real of AD-converting the reference voltage Vref in a state that a power source voltage Vcc for an ordinary operation is supplied to the AD converting section 15; calculating a voltage variation ΔVcc of the power source voltage Vcc for the ordinary operation based on the first conversion value Xref_ideal and the second conversion value Xref_real; and correcting, using the calculated voltage variation ΔVcc, a third conversion value XVin of AD-converting the analog signal Vin in a state that the power source voltage Vcc for the ordinary operation is supplied to the AD converting section 15.

In the above method, a voltage variation of a power source voltage for ordinary operation is calculated on the basis of a first conversion value obtained by AD-converting the reference voltage in a state that a standard power source voltage including no voltage variation is supplied to the AD converting section and a second conversion value obtained by AD-converting the reference voltage in a state that the power source voltage for ordinary operation is supplied to the AD converting section.

A conversion value produced by AD-converting an analog signal is corrected using the calculated voltage variation. Therefore, an error due to a variation of the power source voltage of the AD converting section can be corrected reliably and an error due to its AD conversion characteristic can also be corrected simultaneously. More specifically, since a voltage variation of a power source voltage is calculated in such a manner as to include an error due to the AD conversion characteristic and a conversion value is corrected using the calculated voltage variation, an error due to the AD conversion characteristic that is included in the conversion error is canceled out by the same error included in the voltage variation. In this manner, the error due to the voltage variation and the error due to the AD conversion characteristic can be corrected together. As a result, an error of digital data produced by AD-converting an analog signal can be corrected reliably and AD conversion can be performed with even higher accuracy by the practical method that does not cause, for example, complication of the circuit configuration.

DESCRIPTION OF REFERENCE NUMERALS AND SIGNS

3: Motor
5: PDU
6: Battery
7: DC-DC converter
8: Inverter
9: Charging circuit
10: Microcomputer (AD conversion circuit)
11: Memory (Storage unit)
13: CPU (correction processing section)
15: AD converter (AD converting section)
25: Power circuit

What is claimed is:

1. An AD conversion circuit that converts an input analog signal into digital data and corrects an error of the digital data, the AD conversion circuit comprising:
an AD converting section adapted to receive the analog signal, a power source voltage, and a reference voltage, and to AD-convert the analog signal and the reference voltage using the power source voltage; and
a correction processing section adapted to correct a conversion value which is output by the AD converting section,
wherein the correction processing section is adapted to:
calculate a voltage variation of the actual power source voltage based on a first conversion value obtained by AD-converting the reference voltage by the AD converting section in a state that an ideal power source voltage is supplied to the AD converting section and a second conversion value obtained by AD-converting the reference voltage by the AD converting section in a state that an actual power source voltage is supplied to the AD converting section; and
correct, using the calculated voltage variation, a third conversion value produced by AD-converting the analog signal by the AD converting section in a state that the actual power source voltage is supplied to the AD converting section.

2. The AD conversion circuit according to claim 1, further comprising a storage unit adapted to store the first conversion value and the reference voltage used in determining the first conversion value,
wherein the correction processing section is adapted to calculate the voltage variation of the actual power source voltage based on the first conversion value stored in the storage unit and the second conversion value obtained by AD-converting the reference voltage by the AD converting section in the state that the actual power source voltage is supplied to the AD converting section.

3. The AD conversion circuit according to claim 1, wherein the correction processing section (13) is adapted to calculate the voltage variation ($\Delta Vcc$) of the actual power source voltage (Vcc), according to an Equation (A):

$$\Delta Vcc = Vcc \times \{Xref\_real/Xref\_ideal - 1\} \quad (A)$$

wherein the voltage variation is $\Delta Vcc$, the power source voltage is Vcc, the first conversion value is Xref_ideal, and the second conversion value is Xref_real.

4. The AD conversion circuit according to claim 3, wherein the AD converting section (15) is adapted to output the third conversion value (XVin) according to an Equation (B):

$$XVin = Vin \times 2^R / (Vcc + \Delta Vcc) \quad (B)$$

wherein the third conversion value is XVin, and a number of bits representing a resolution of the AD converting section is R, and
wherein the correction processing section (13) produces a corrected conversion value (XVin') by correcting the third conversion value (XVin) according to Equation (C):

$$XVin' = XVin \times Vcc/(Vcc + \Delta Vcc) \quad (C)$$

wherein the corrected conversion value is XVin'.

5. The AD conversion circuit according to claim 1, wherein the reference voltage is set at a voltage value that is within or close to a range of the analog signal.

6. An error correcting method for correcting an output conversion value of an AD converting section which receives an input analog signal, a power source voltage, and a reference voltage, and AD-converts the analog signal and the reference voltage using the power source voltage, the method comprising:
obtaining a first conversion value of AD-converting the reference voltage in a state that an ideal power source voltage supplied to the AD converting section;
obtaining a second conversion value of AD-converting the reference voltage in a state that an actual power source voltage is supplied to the AD converting section;
calculating a voltage variation of the actual power source voltage based on the first conversion value and the second conversion value; and
correcting, using the calculated voltage variation, a third conversion value of AD-converting the analog signal in a state that the actual power source voltage is supplied to the AD converting section.

* * * * *